US009842890B2

(12) United States Patent
Jang et al.

(10) Patent No.: US 9,842,890 B2
(45) Date of Patent: Dec. 12, 2017

(54) METHOD OF MANUFACTURING DISPLAY DEVICE

(71) Applicant: Samsung Display Co., Ltd., Yongin, Gyeonggi-Do (KR)

(72) Inventors: Yongjae Jang, Yongin (KR); Jaehyuk Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/089,323

(22) Filed: Apr. 1, 2016

(65) Prior Publication Data

US 2017/0033315 A1   Feb. 2, 2017

(30) Foreign Application Priority Data

Jul. 30, 2015   (KR) .................. 10-2015-0108145

(51) Int. Cl.
*H01L 27/32* (2006.01)
*H01L 51/52* (2006.01)

(52) U.S. Cl.
CPC ...... *H01L 27/3244* (2013.01); *H01L 51/5209* (2013.01); *H01L 51/5268* (2013.01); *H01L 51/5218* (2013.01)

(58) Field of Classification Search
CPC combination set(s) only.
See application file for complete search history.

(56) References Cited

U.S. PATENT DOCUMENTS

| 5,447,598 A | 9/1995 | Mihara et al. |
| 2011/0012139 A1 | 1/2011 | Yamamoto |
| 2013/0234294 A1 | 9/2013 | Hu et al. |
| 2015/0041765 A1 | 2/2015 | Ahn et al. |

FOREIGN PATENT DOCUMENTS

| JP | 2009-259805 A | 11/2009 |
| JP | 2014-220159 A | 11/2014 |
| KR | 10-2008-0064336 A | 7/2008 |
| KR | 10-2014-0058972 A | 5/2014 |

OTHER PUBLICATIONS

Jin Yeong Kim et al., Extracting optical modes of organic light-emitting diodes using quasi-periodic WO3 nanoislands, Optics Express 5424, Mar. 11, 2013, vol. 21, No. 5, 2013 Optical Society of America.

*Primary Examiner* — Matthew Reames
(74) *Attorney, Agent, or Firm* — H.C. Park & Associates, PLC

(57) ABSTRACT

A method of manufacturing a display device includes forming an electrode layer including a first metallic element on a substrate; sequentially forming an insulating layer including a first material and a photosensitive pattern layer including a first pattern on the electrode layer; forming a plurality of fine patterns including a first layer that includes the first material and a second layer by etching the photosensitive pattern layer and the insulating layer; and forming a plurality of scattering bumps by removing the second layer of each of the plurality of fine patterns.

20 Claims, 6 Drawing Sheets

METHOD OF MANUFACTURING DISPLAY DEVICE

CLAIM OF PRIORITY

This application makes reference to, incorporates the same herein, and claims all benefits accruing under 35 U.S.C. §119 from an application for an METHOD OF MANUFACTURING DISPLAY DEVICE earlier filed in the Korean Intellectual Property Office on Jul. 30, 2015, and their duly assigned Korean Patent Application No. 10-2015-0108145.

BACKGROUND OF THE INVENTION

Field of the Invention

One or more exemplary embodiments relate to a method of manufacturing a display device.

Description of the Related Art

Generally, an organic light-emitting display device is a self-luminous display device and has advantages of wide viewing angles, excellent contrast, and fast response speeds.

Accordingly, the organic light-emitting display device is applicable to a display device for a mobile apparatus such as a digital camera, a video camera, a camcorder, a personal digital assistant, or a large-scale electronic/electric product such as an ultra-slim television, and thus the organic light-emitting display device is in the limelight.

The organic light-emitting display device may produce colors by using a principle in which a hole and an electron injected to an anode and a cathode recombine in an organic emission layer to emit light. While exiton in which a hole and an electron recombine falls from an excited state to a ground state, light is emitted.

In the organic light-emitting display device, only about 20% of light emitted from the organic emission layer is emitted to the outside, and about 80% of the light, which is the rest of the emitted light, may be extinct inside the organic light-emitting display device. Therefore, the organic light-emitting display device requires a structure that may improve light efficiency.

SUMMARY OF THE INVENTION

One or more exemplary embodiments include a method of manufacturing a display device.

Additional aspects will be set forth in part in the description which follows and, in part, will be apparent from the description, or may be learned by practice of the presented embodiments.

According to one or more exemplary embodiments, a method of manufacturing a display device includes forming an electrode layer including a first metallic element on a substrate; sequentially forming an insulating layer including a first material and a photosensitive pattern layer including a first pattern on the electrode layer; forming a plurality of fine patterns including a first layer that includes the first material and a second layer by etching the photosensitive pattern layer and the insulating layer; and forming a plurality of scattering bumps by removing the second layer of each of the plurality of fine patterns.

An upper surface of the photosensitive pattern layer may be an uneven surface including concave and convex portions.

The first pattern may include a plurality of recesses which are concave in a thickness direction of the photosensitive pattern layer.

For each of the plurality of recesses, a depth of a central region is greater than a depth of an edge region.

For each of the plurality of recesses, a depth of the recess may gradually reduce toward the edge region from the central region.

Thicknesses of portions of the photosensitive pattern layer that correspond to edge regions of the recesses may be greater than thicknesses of portions of the photosensitive pattern layer that correspond to central regions of the recesses.

The forming of the plurality of fine patterns may include etching the photosensitive pattern layer and the insulating layer to expose the electrode layer.

The second layer may include the first metallic element.

The second layer may further include carbon.

In the forming of the plurality of fine patterns, the etching may include using an etching gas including carbon.

The etching may be an anisotropic dry etching.

The etching gas may include one of $CF_2$, $C_2F_6$, and $C_4F_8$.

The electrode layer may be a pixel electrode of the display device.

The insulating layer may include an inorganic material.

The inorganic material may include at least one of $SiO_x$ and $SiN_x$.

The electrode layer may include a metallic oxide having transparency.

The electrode layer may include a metal having reflectivity.

A method of manufacturing a display device according to an exemplary embodiment has an advantage of improving white angular dependency (WAD) even without change in a color coordinate of the display device by disposing scattering bumps on an electrode layer.

BRIEF DESCRIPTION OF THE DRAWINGS

These and/or other aspects will become apparent and more readily appreciated from the following description of the exemplary embodiments, taken in conjunction with the accompanying drawings in which:

FIG. 8 is a schematic cross-sectional view illustrating a method of manufacturing the display device of FIG. 1.

DETAILED DESCRIPTION OF THE INVENTION

Figure 1:
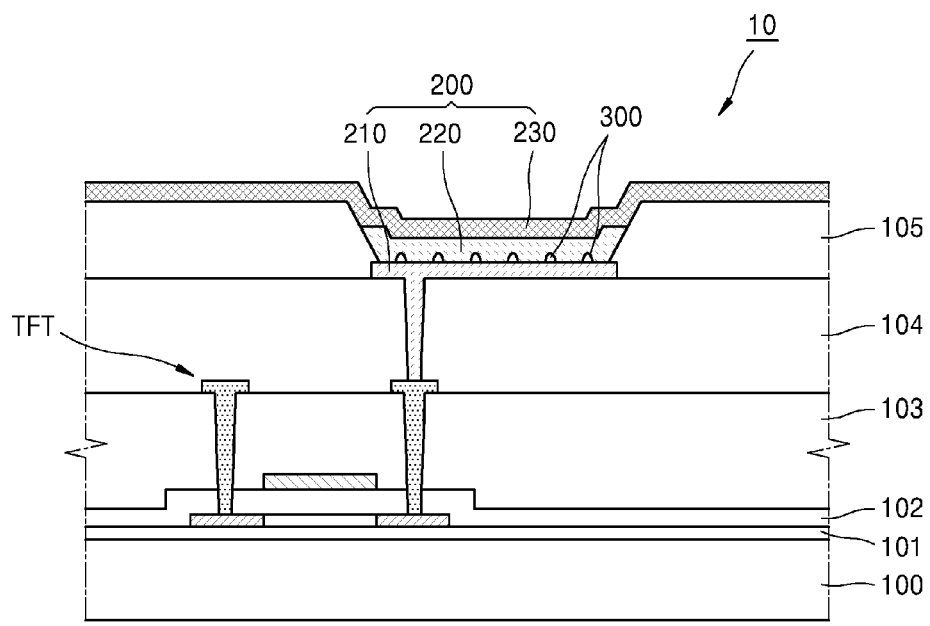
FIG. 1 is a schematic cross-sectional view illustrating a display device according to an exemplary embodiment.

As the inventive concept allows for various changes and numerous embodiments, exemplary embodiments will be illustrated in the drawings and described in detail in the written description. An effect and a characteristic of the inventive concept, and a method for accomplishing these will be apparent when exemplary embodiments described below in detail are referred together with the drawings.

However, the inventive concept is not limited to exemplary embodiments described below and may be implemented in various forms.

Expressions such as "at least one of," when preceding a list of elements, modify the entire list of elements and do not modify the individual elements of the list.

Hereinafter, exemplary embodiments are described in detail with reference to the accompanying drawings Like reference numerals are used for like or corresponding elements when description is made with reference to the drawings, and repeated description thereof is omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Generally, an organic light-emitting display device is a self-luminous display device and has advantages of wide viewing angles, excellent contrast, and fast response speeds.

Accordingly, the organic light-emitting display device is applicable to a display device for a mobile apparatus such as a digital camera, a video camera, a camcorder, a personal digital assistant, or a large-scale electronic/electric product such as an ultra-slim television, and thus the organic light-emitting display device is in the limelight.

The organic light-emitting display device may produce colors by using a principle in which a hole and an electron injected to an anode and a cathode recombine in an organic emission layer to emit light. While exiton in which a hole and an electron recombine falls from an excited state to a ground state, light is emitted.

In the organic light-emitting display device, only about 20% of light emitted from the organic emission layer is emitted to the outside, and about 80% of the light, which is the rest of the emitted light, may be extinct inside the organic light-emitting display device. Therefore, the organic light-emitting display device requires a structure that may improve light efficiency.

FIG. 1 is a schematic cross-sectional view illustrating a display device 10 according to an exemplary embodiment.

The display device 10 may be a display device such as a liquid crystal display device, an organic light-emitting diode (OLED) display device, and a flexible display device. Though the kind of a display device according to an exemplary embodiment is not limited, an OLED display device is exemplarily described for convenience in description.

Referring to FIG. 1, an OLED display device 10 may include a substrate 100, a thin film transistor (TFT) on the substrate 100, and an OLED 200 electrically connected with the TFT. Though FIG. 1 illustrates one TFT between the substrate 100 and the OLED 200, the OLED display device 10 may include a plurality of TFTs, and may further include a storage capacitor (not shown).

The substrate 100 may be rigid or flexible. The substrate 100 may include a glass material, a metallic material, or a plastic material such as polyethylene terephthalate (PET), polyethylene naphthalate (PEN), and polyimide.

Components such as a buffer layer 101 for preventing impurities from penetrating into a semiconductor layer of the TFT, a gate insulating layer 102 for insulating the semiconductor layer of the TFT from a gate electrode, an interlayer insulating layer 103 for insulating a source electrode and a drain electrode of the TFT from the gate electrode, and a planarization layer 104 covering the TFT and having an approximately flat upper surface may be located on the substrate 100.

The OLED 200 may include an electrode layer 210, an intermediate layer 220 on the electrode layer 210, and an opposite electrode 230 on the intermediate layer 220. According to the present exemplary embodiment, the electrode layer 210 may be an anode, and the opposite electrode 230 may be a cathode. However, exemplary embodiments of the inventive concept are not limited thereto, and the electrode layer 210 may be a cathode and the opposite electrode 230 may be an anode depending on a driving method of the OLED display device 10. A hole and an electron from the electrode layer 210 and the opposite electrode 230 are injected into an emission layer included in the intermediate layer 220. While exiton in which the injected hole and electron are recombined falls from an excited state to a ground state, light is emitted.

The electrode layer 210 may be electrically connected with one of the source electrode and the drain electrode of the TFT. The electrode layer 210 may include a metallic oxide having transparency. For example, the electrode layer 210 may include at least one of indium tin oxide (ITO), indium zinc oxide (IZO), zinc oxide (ZnO), indium oxide (In2O3), indium gallium oxide (IGO), aluminum zinc oxide (AZO), and gallium zinc oxide (GZO). Alternatively, the electrode layer 210 may include a triple structure including a transparent conductive oxide layer/semitransparent metallic layer/transparent conductive oxide layer. The kind of the material of the electrode layer 210 according to an exemplary embodiment is not limited. According to another exemplary embodiment, the electrode layer 210 may include a reflective electrode. For example, the electrode layer 210 may include a reflective layer including Ag, Mg, Al, Pt, Pd, Au, Ni, Nd, Ir, Cr, or a compound thereof, etc.

A pixel-defining layer 105 exposes an upper surface of the electrode layer 210 via an opening, and the intermediate layer 220 including the emission layer may be located on the exposed upper surface of the electrode layer 210.

A plurality of scattering bumps 300 may be located between the electrode layer 210 and the intermediate layer 220. The plurality of scattering bumps 300 may be disposed in the form of fine convex lenses on the upper surface of the electrode layer 210 and disposed in various sizes. The plurality of scattering bumps 300 may include an inorganic material, and the inorganic material may include at least one of SiOx and SiNx. The plurality of scattering bumps 300 may be disposed between the electrode layer 210 and the intermediate layer 220 to effectively increase efficiency of light generated from the OLED 200. Also, the plurality of scattering bumps 300 may minimize transformation of spectrum by unintended resonance by suppressing occurrence of unintended resonance between the electrode layer 210 and the opposite electrode 230.

The intermediate layer 220 includes an organic emission layer that emits red, green, or blue light. For the organic emission layer, a low molecular organic material or a polymer organic material may be used. In the case where the organic emission layer is a low molecular organic layer including a low molecular organic material, a hole transport layer (HTL) and a hole injection layer (HIL), etc. are located in a direction of the electrode layer 210 with respect to the organic emission layer, and an electron transport layer (ETL) and an electron injection layer (EIL), etc. are stacked in a direction of the opposite electrode 230. As understood by one of ordinary skill in the art, various layers besides the HIL, HTL, EIL, and ETL, may be stacked when needed.

The opposite electrode 230 facing the electrode layer 210 is disposed on the intermediate layer 220. The opposite electrode 230 is used as a transparent electrode or a reflective electrode. In the case where the opposite electrode 230 is used as the transparent electrode, a metal having a small work function, that is, Li, Ca, LiF/Ca, LiF/Al, Al, Ag, Mg, and a compound thereof is deposited thin such that the metal faces the organic emission layer, and then an auxiliary electrode layer or a bus electrode line may be formed on the metal by using a transparent conductive oxide such as ITO, IZO, ZnO, or In2O3. Also, in the case where the opposite electrode 230 is used as the reflective electrode, Li, Ca, LiF/Ca, LiF/Al, Al, Ag, Mg, and a compound thereof are entirely deposited.

Hereinafter, a method of manufacturing the OLED display device 10 according to an exemplary embodiment is described with reference to FIGS. 2 to 8.

FIGS. 2 to 8 are schematic cross-sectional views illustrating a method of manufacturing the OLED display device 10 of FIG. 1.

Figure 2:
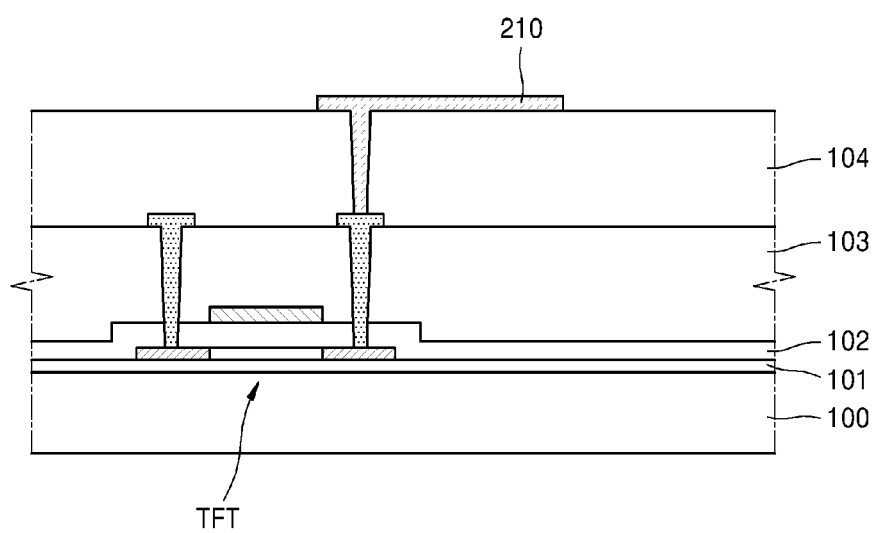
FIGS. 2 to 5, and 8 are schematic cross-sectional views illustrating a method of manufacturing the display device of FIG. 1.

Referring to FIG. 2, the OLED 200 is formed on the substrate 100. The OLED 200 may include the electrode layer 210, the intermediate layer 220 including the emission layer, and the opposite electrode 230.

Before the OLED 200 is formed, various layers may be formed on the substrate 100. As described with reference to FIG. 1, the TFT may be formed on the substrate 100, and insulating layers such as the buffer layer 101 for preventing impurities from penetrating into the semiconductor layer of the TFT, the gate insulating layer 102 for insulating the semiconductor layer of the TFT from the gate electrode, the interlayer insulating layer 103 for insulating the source electrode and the drain electrode of the TFT from the gate electrode, and the planarization layer 104 covering the TFT and having an approximately flat upper surface may be formed on the substrate 100.

The electrode layer 210 may include a first metallic element. According to an exemplary embodiment, in the case where the electrode layer 210 has transparency, the electrode layer 210 may include at least one metallic oxide including ITO, IZO, GZO, and ZnO. Alternatively, the electrode layer 210 may include a triple structure (not shown) including a transparent conductive oxide layer/semitransparent metallic layer/transparent conductive oxide layer. The first metallic element may be determined depending on the kind of the metallic oxide forming the electrode layer 210. The metallic oxide may include at least one of indium, tin, gallium, and zinc.

According to another exemplary embodiment, in the case where the electrode layer 210 is a reflective electrode layer, the electrode layer 210 may be formed by entirely depositing Li, Ca, LiF/Ca, LiF/Al, Al, Ag, Mg, and a compound thereof, and the first metallic element may include at least one of Li, Ca, Al, Ag, and Mg.

Figure 3:
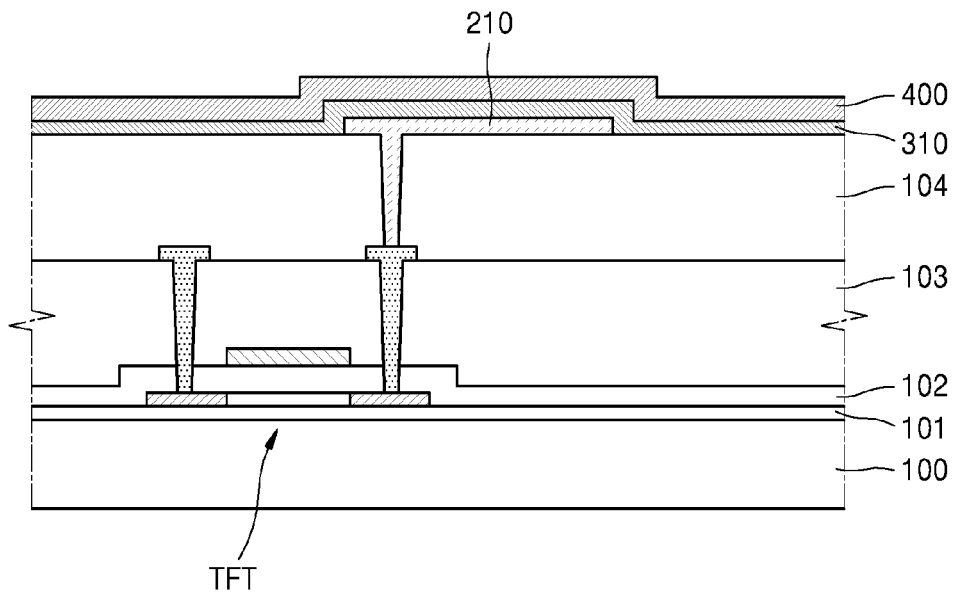

Referring to FIG. 3, an insulating layer 310 and a photoresist (PR) layer 400 are sequentially stacked on the electrode layer 210.

The insulating layer 310 may include a first material. The first material may be an inorganic material, and the inorganic material may include a material having insulation such as SiOx and SiNx.

The PR layer 400 is formed on the insulating layer 310. A material of the PR layer 400 may be one of a positive PR and a negative PR, and exemplary embodiments of the inventive concept are not limited thereto. Description is mainly made for the case where a material of the PR layer 400 is a positive PR, for convenience in description.

Figure 4:
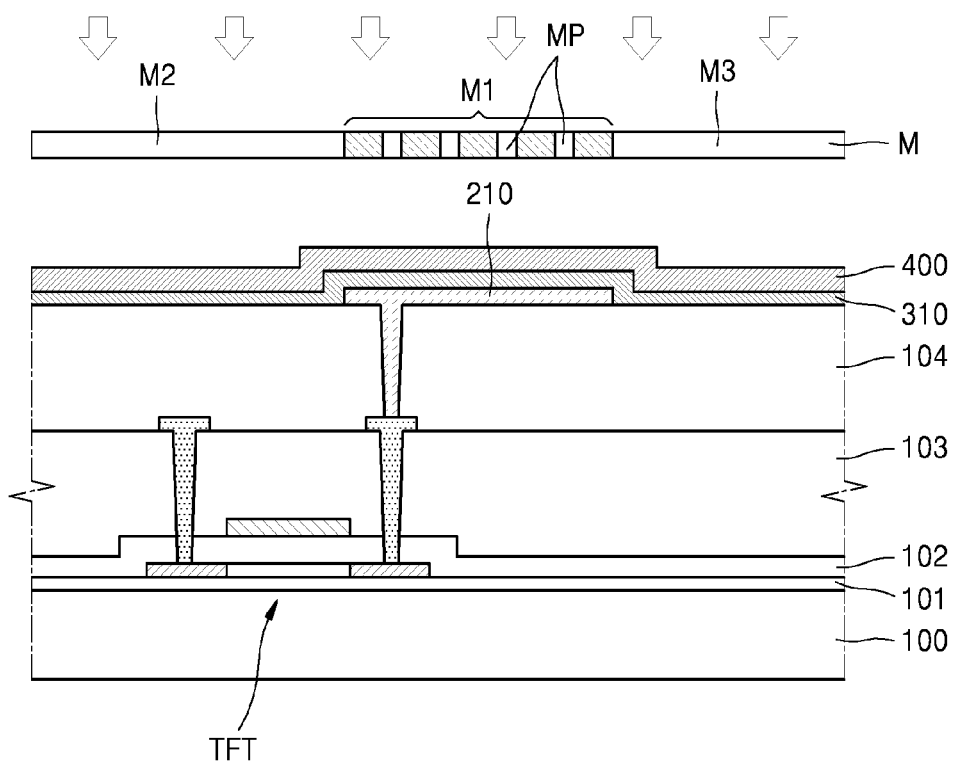
Figure 5:
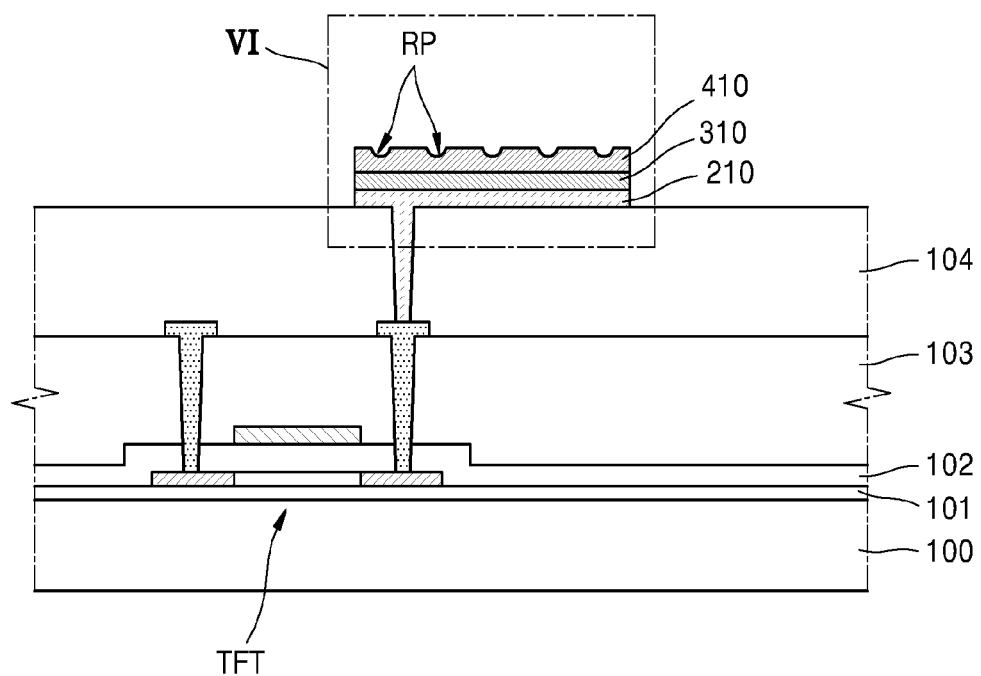

Referring to FIGS. 4 and 5, after a first photo mask M is disposed on the PR layer 400 illustrated in FIG. 3, a photosensitive pattern layer 410 may be formed by using an exposure and developing process.

The first photo mask M may include a first region M1 including a mask pattern MP and corresponding to the electrode layer 210. And the first photo mask M may include a second region M2 and a third region M3 provided to both sides of the first region M1.

The mask pattern MP of the first region M1 may be disposed to correspond to a first pattern RP of the photosensitive pattern layer 410 described later. In the case where a material of the PR layer 400 is a positive PR, the mask pattern MP may include light-transmission portion that transmits light, and a portion of the first region M1 that excludes the mask pattern MP may include a light-blocking portion that blocks light.

According to an exemplary embodiment, the second region M2 and the third region M3 of the first photo mask M may be formed as light transmission portions that transmit light, so that the rest of the insulating layer 310 except a portion of the insulating layer 310 that corresponds to the electrode layer 210 may be removed. According to another exemplary embodiment, the second region M2 and the third region M3 are formed as light-blocking portions that block light, so that an etching process may be performed without removing the insulating layer 310. In this case, since the rest of the insulating layer 310 except a portion of the insulating layer 310 that corresponds to the electrode layer 210 may be removed by an etching process described later, addition of an etching or ashing process is not required compared with the above exemplary embodiment. However, description is mainly made for the case where the second region M2 and the third region M3 of the first photo mask M are formed as light transmission portions, for convenience in description. In the drawings to facilitate understanding, but the exaggerated thickness of the center of the first pattern RP, the central part of the first pattern RP can be substantially removed by the etching, similarly to the second region M2 and third region M3.

The photosensitive pattern layer 410 may include the first pattern RP. The first pattern RP may include a plurality of concave recesses along a thickness direction of the photosensitive pattern layer 410. Though FIG. 5 illustrates a plurality of regularly disposed recesses, this is only exemplary, and the disposition configuration of the plurality of recesses is not limited thereto.

FIGS. 6A, 6B, 6C, and 6D are enlarged views of portion VI of FIG. 5 explaining a method of forming scattering bumps of an OLED display device 10 according to an exemplary embodiment.

Figure 6A:
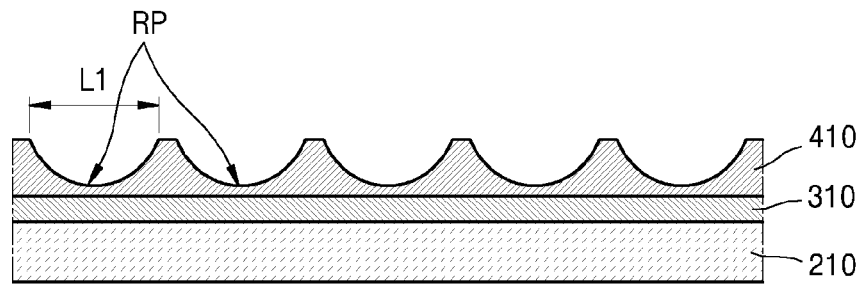
FIGS. 6A, 6B, 6C, and 6D are enlarged views of portion VI of FIG. 5 explaining a method of forming scattering bumps of a display device according to an exemplary embodiment.

Referring to FIG. 6A, since the first pattern RP of the photosensitive pattern layer 410 includes a plurality of recesses formed in the upper surface of the photosensitive pattern layer 410, the upper surface of the photosensitive pattern layer 410 may include a concave-and-convex uneven surface. The first pattern RP of the photosensitive pattern layer 410 is formed on a position corresponding to the mask pattern MP of the first photo mask M. In the case where a material of the photosensitive pattern layer 410 is a positive PR, since the mask pattern MP includes light transmission portions that transmit light, the first pattern RP may include a plurality of recesses in which a depth of a central region of each recess is greater than a depth of an edge region of each recess. A thickness of a portion of the photosensitive pattern layer 410 that corresponds to the edge region of the recesses may be greater than a thickness of a portion of the photosensitive pattern layer 410 that corresponds to the central region of the recesses. A depth of each of the plurality of recesses may gradually reduce toward the edge region from the central region, and a depth of the central region may be less than a maximum thickness of the photosensitive pattern layer. Therefore, the plurality of recesses are not openings obtained by completely removing the photoresist layer, and the photoresist layer may remain on the central region of each of the plurality of recesses.

Figure 6B:
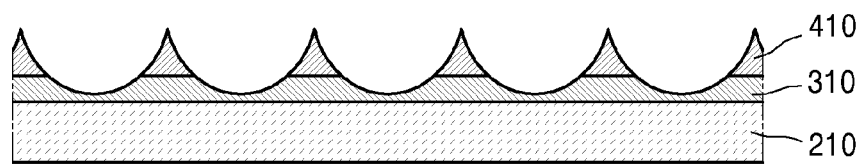
Figure 6C:
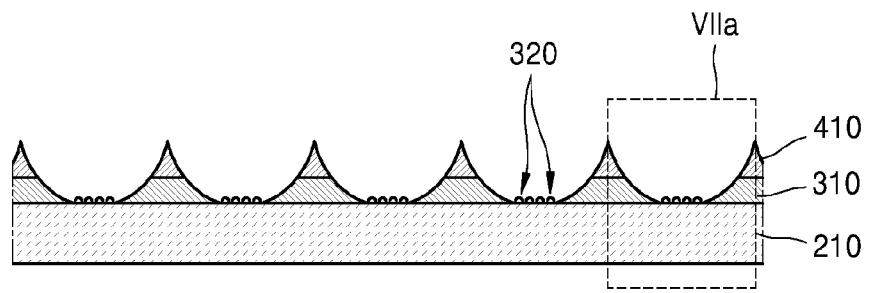

Referring to FIGS. 6B and 6C, the photosensitive pattern layer 410 including the first pattern RP and the insulating layer 310 are etched simultaneously. As the etching is performed, a width L1 of the plurality of recesses increases more and more, and a depth of the plurality of recesses increases more and more, and thus the electrode layer 210 may be exposed. As the etching process is performed, a plurality of fine patterns 320 are formed on the electrode layer 210. The plurality of fine patterns may include a first layer 317 (see FIG. 7A) including a first material, and a second layer 315 (see FIG. 7A) including a first metallic element.

Figure 6D:
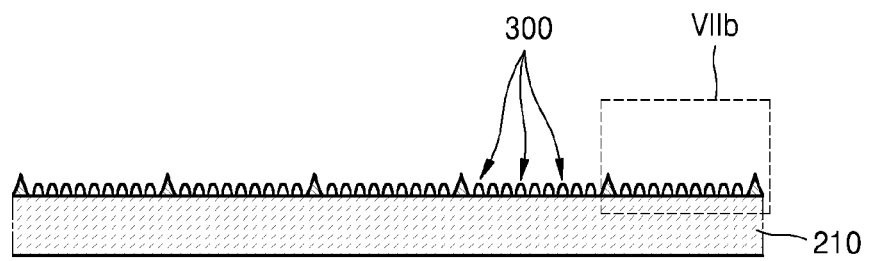

Referring to FIG. 6D, a plurality of scattering bumps 300 may be formed by processing the plurality of fine patterns 320. For example, the plurality of scattering bumps 300 may be formed by performing a PR stripping process on each of the fine patterns 320 including the first layer 317 and the second layer 315 and removing the second layer 315. The scattering bump 300 corresponds to a state in which the second layer 315 has been removed from the fine pattern 320 including the first layer 317 and the second layer 315.

Hereinafter, the processes of FIGS. 6C and 6D are described below with reference to FIGS. 7A and 7B.

Figure 7A:
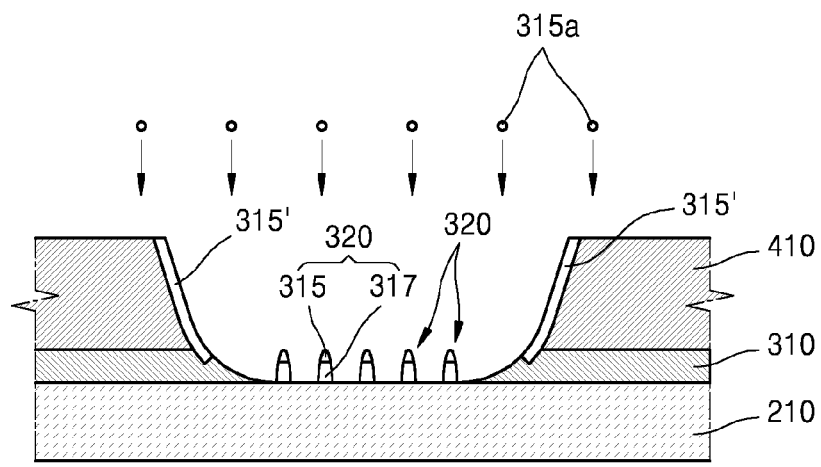
FIG. 7A is an enlarged view of a portion VIIa illustrated in FIG. 6C, and FIGS. 7B to 7C are enlarged views of a portion VIIb illustrated in FIG. 6D
Figure 7B:
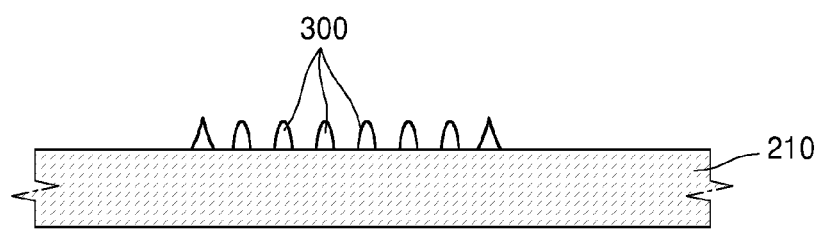
Figure 7C:
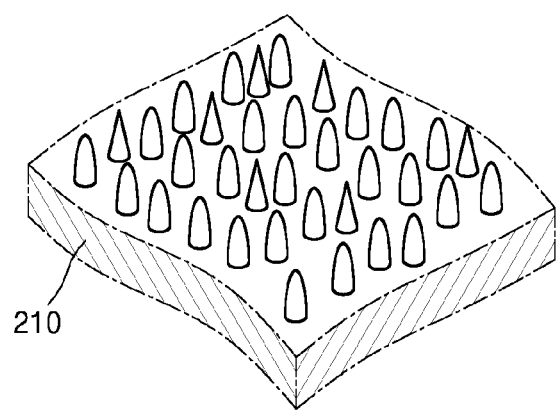

FIG. 7A is an enlarged view of a portion VIIa illustrated in FIG. 6C, and FIGS. 7B to 7C are enlarged views of a portion VIIb illustrated in FIG. 6D.

Referring to FIG. 7A, a process of etching the photosensitive pattern layer 410 and the insulating layer 310 may be a dry etching that uses an etching gas 315a. The dry etching is an etching that is performed by inducing plasma while the etching gas 315a is injected. The dry etching may perform an anisotropic etching. In the case where positive ions of an etching gas are taken substantially perpendicularly to the photosensitive pattern layer 410 by a bias electric potential, the etching process is induced and performed in a direction perpendicular to the surface of the photosensitive pattern layer 410. In other words, the dry etching may be an anisotropic etching having etching directionality.

The etching gas 315a may include carbon. The etching gas 315a may include a fluorocarbon compound-based etching gas. For example, the etching gas 315a may include one of CF2, C2F6, and C4F8.

When the electrode layer 210 starts to be exposed by the etching, the first metallic elements of the electrode layer 210 react to the carbon of the etching gas to generate a polymer. The polymer may include at least one (referred to as the first metallic element, hereinafter) of the metallic elements included in the electrode layer 210, and carbon. As described above, the first metallic element may include indium, gallium, zinc, tin, etc. depending on the kind of the material of the electrode layer 210. Since the polymer includes the first metallic element, the polymer may be a metallic polymer and is not removed by the etching process but attached on an etching surface 315' to hinder the etching.

Since a depth of the plurality of recesses formed in the photosensitive pattern layer 410 gradually reduces toward the edge region from the central region, the etching surface 315' of the plurality of recesses has an angle of 0 degree or more with respect to a progression direction of the anisotropic dry etching. In this case, since the polymer is formed on a portion of the etching surface 315', the polymer is not completely etched by the anisotropic dry etching. That is, portions of the insulating layer 310 remain on the electrode layer 210 with the polymer used as a mask, so that the plurality of fine patterns 320 may be formed on the exposed surface of the electrode layer 210. The plurality of fine patterns 320 may include the first layer 317 including a portion of the insulating layer 310 and the second layer 315 including the polymer. The first layer 317 may include a first material which is an inorganic material, and the polymer may include the first metallic element and carbon. The plurality of fine patterns 320 may be formed in a random size.

While the anisotropic dry etching is performed, the width of the etching surface 315' of a recess increases toward the edge region from the central region, and the exposed surface of the electrode layer 210 increases, so that the plurality of fine patterns 320 may be formed on the entire upper surface of the electrode layer 210.

Referring to FIGS. 7B to 7C, the plurality of scattering bumps 300 are formed by removing the second layer 315 from the plurality of fine patterns 320. The second layer 315 may be removed by a PR stripping process, and the first layer 317 may become the scattering bump 300 by the PR stripping process. The surface of the first layer 317 is trimmed during the PR stripping process, so that the scattering bump 300 may have a lens shape.

Figure 8:
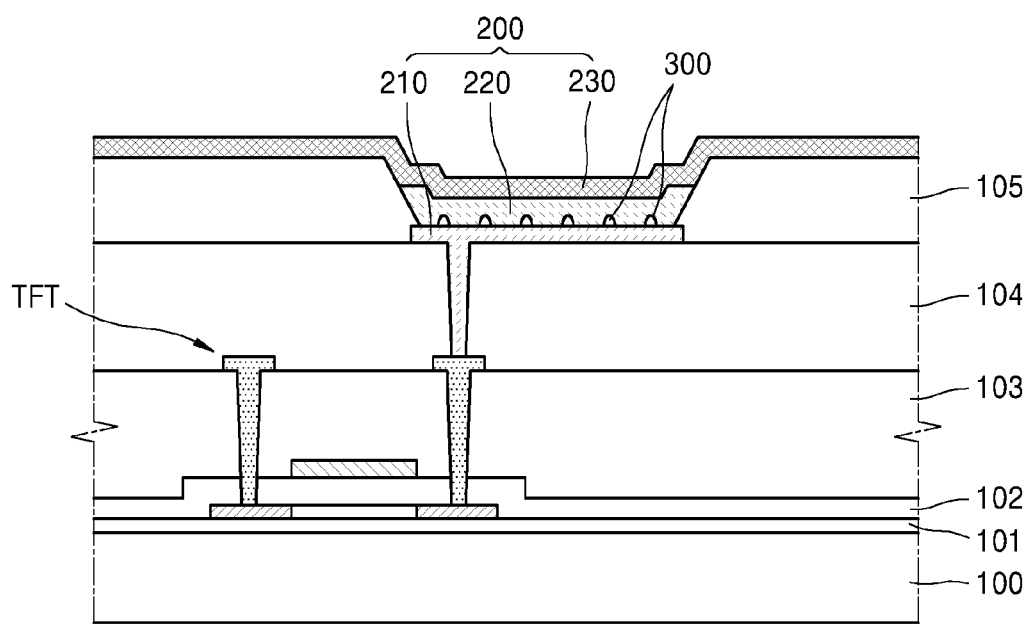

Referring to FIG. 8, the OLED 200 including the intermediate layer 220 and the opposite electrode 230 may be formed on the results of FIG. 7B.

The pixel-defining layer 105 exposes an upper surface of the electrode layer 210 via an opening, and the intermediate layer 220 including the emission layer may be located on the exposed upper surface of the electrode layer 210. The opposite electrode 230 facing the electrode layer 210 may be disposed on the intermediate layer 220.

Table 1 represents white angular dependency (WAD) (based on 60 degrees) and a front color coordinate of a display device according to comparison examples and exemplary embodiments.

TABLE 1

| Division | WAD (60 degrees) | Front color coordinate | |
|---|---|---|---|
| | | X | Y |
| Comparison example 1 | 0.015 | 0.335 | 0.629 |
| Comparison example 2 | 0.018 | 0.338 | 0.626 |
| Exemplary embodiment 1 | 0.0019 | 0.337 | 0.627 |
| Exemplary embodiment 2 | 0.0022 | 0.340 | 0.625 |

In Table 1, the comparison examples 1 and 2 represent a display device not having scattering bumps, and the exemplary embodiments 1 and 2 represent a display device having scattering bumps illustrated in FIG. 1.

Referring to Table 1, since the color coordinates of the exemplary embodiments 1 and 2 are included in an error range (±0.005) of the color coordinates of the comparison examples 1 and 2, in the case of the display device according to the exemplary embodiments 1 and 2, it is revealed that the color coordinate does not substantially change compared to the comparison examples 1 and 2. In contrast, a white angular dependency (WAD) (based on 60 degrees) value according to the exemplary embodiments 1 and 2 has improved by an error range (±0.2%) or more of a WAD value of the comparison examples 1 and 2. The WAD is a value representing a rate of change in a front brightness value with respect to a brightness value at a reference angle. When the WAD value is small, WAD is increased. That is, in the case of the display device according to the exemplary embodiments, since the WAD value has remarkably reduced compared to the comparison examples, it is known that the situation of WAD has improved.

As described above, the scattering bumps 300 formed by the method of manufacturing the display device 10 according to an exemplary embodiment may be formed in a random size, and formed fine in a size of tens of nanometers and effectively increase light efficiency by scattering. Also, the display device 10 according to an exemplary embodiment may improve the WAD even without change in a color coordinate of the display device by disposing the scattering bumps 300 on the electrode layer 210.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
    forming an electrode layer comprising a first metallic element on a substrate;
    sequentially forming an insulating layer comprising a first material and a photosensitive pattern layer comprising a first pattern on the electrode layer;
    forming a plurality of fine patterns comprising a first layer that comprises the first material and a second layer by etching the photosensitive pattern layer and the insulating layer; and
    forming a plurality of scattering bumps by removing the second layer of each of the plurality of fine patterns.

2. The method of claim 1, wherein an upper surface of the photosensitive pattern layer comprises an uneven surface comprising concave and convex portions.

3. The method of claim 1, wherein the first pattern comprises a plurality of recesses which are concave in a thickness direction of the photosensitive pattern layer.

4. The method of claim 3, wherein, for each of the plurality of recesses, a depth of a central region is greater than a depth of an edge region.

5. The method of claim 4, wherein, for each of the plurality of recesses, a depth of the recess gradually reduces toward the edge region from the central region.

6. The method of claim 3, wherein thicknesses of portions of the photosensitive pattern layer that correspond to edge regions of the recesses are greater than thicknesses of portions of the photosensitive pattern layer that correspond to central regions of the recesses.

7. The method of claim 1, wherein the forming of the plurality of fine patterns comprises etching the photosensitive pattern layer and the insulating layer to expose the electrode layer.

8. The method of claim 1, wherein the second layer comprises the first metallic element.

9. The method of claim 8, wherein the second layer further comprises carbon.

10. The method of claim 1, wherein in the forming of the plurality of fine patterns, the etching comprises using an etching gas including carbon.

11. The method of claim 10, wherein the etching is an anisotropic dry etching.

12. The method of claim 10, wherein the etching gas comprises one of $CF_2$, $C_2F_6$, and $C_4F_8$.

13. The method of claim 1, wherein the electrode layer is a pixel electrode of the display device.

14. The method of claim 1, wherein the insulating layer comprises an inorganic material.

15. The method of claim 14, wherein the inorganic material comprises at least one of $SiO_x$ and $SiN_x$.

16. The method of claim 1, wherein the electrode layer comprises a metallic oxide having transparency.

17. The method of claim 1, wherein the electrode layer comprises a metal having reflectivity.

18. A method of manufacturing a display device, the method comprising:
    forming an electrode layer comprising a first metallic element on a substrate;
    sequentially forming an insulating layer comprising a first material and a photosensitive pattern layer comprising a first pattern on the electrode layer;
    forming a plurality of fine patterns comprising a first layer that comprises the first material and a second layer by simultaneously etching the photosensitive pattern layer and the insulating layer, the first layer including the first material and the second layer including the first metallic element; and
    forming a plurality of scattering bumps by removing the second layer of each of the plurality of fine patterns.

19. A method for manufacturing a display device, the method comprising:
    forming a pixel electrode layer positioned on a substrate, forming a plurality of spaced-apart scattering bumps on the pixel electrode layer, forming an intermediate layer covering the scattering bumps, forming an opposite electrode layer on the intermediate layer, and wherein:

each of the scattering bumps has a lens shape that protrudes from the opposite electrode layer, and forming the scattering bumps comprises:
- forming the electrode layer comprising a first metallic element on the substrate;
- sequentially forming an insulating layer comprising a first material and a photosensitive pattern layer comprising a first pattern on the pixel electrode layer;
- forming a plurality of fine patterns comprising a first layer that comprises the first material and a second layer by etching the photosensitive pattern layer and the insulating layer; and
- forming the scattering bumps by removing the second layer of each of the plurality of fine patterns.

20. The method of claim 19, wherein:

an upper surface of the photosensitive pattern layer comprises an uneven surface comprising concave and convex portions;

the first pattern comprises a plurality of recesses which are concave in a thickness direction of the photosensitive pattern layer; and for each of the plurality of recesses, a depth of a central region is greater than a depth of an edge region.

* * * * *